United States Patent [19]

Schumer

[11] Patent Number: 4,763,005

[45] Date of Patent: Aug. 9, 1988

[54] ROTATING FIELD ELECTRON BEAM APPARATUS AND METHOD

[76] Inventor: Steven E. Schumer, 3604 Mona Way, San Jose, Calif. 95130

[21] Appl. No.: 893,860

[22] Filed: Aug. 6, 1986

[51] Int. Cl.[4] .......................................... H01J 37/147
[52] U.S. Cl. ................................. 250/492.3; 250/398
[58] Field of Search ............................. 250/492.3, 398

[56] References Cited

U.S. PATENT DOCUMENTS

| | | | |
|---|---|---|---|
| 2,724,059 | 11/1955 | Gale | 250/492.3 |
| 3,013,154 | 12/1961 | Trump | 250/492.3 |
| 3,687,716 | 8/1972 | Steigerwald | 250/492.3 |
| 3,714,416 | 1/1973 | Link et al. | 250/492.3 |
| 4,366,383 | 12/1982 | Sano et al. | 250/492.24 |
| 4,543,487 | 9/1985 | Puumalainen et al. | 250/492.3 |
| 4,551,606 | 11/1985 | Inoue | 250/492.3 |

Primary Examiner—Craig E. Church
Assistant Examiner—Jack I. Berman
Attorney, Agent, or Firm—Townsend & Townsend

[57] ABSTRACT

An improved method and apparatus for bombarding an object with charged particles. A shaping magnet is provided to spread the beam of charged particles emitted by a charged particle gun after the beam has left the gun. The beam is shaped so that it will completely envelope the object and provide substantially uniform penetration. The shaping of the electron beam is done after the beam has left the electron gun, unlike the prior art devices which shape the beam in the gun to produce a focusing effect. This provides more control over the shape of the beam.

11 Claims, 8 Drawing Sheets

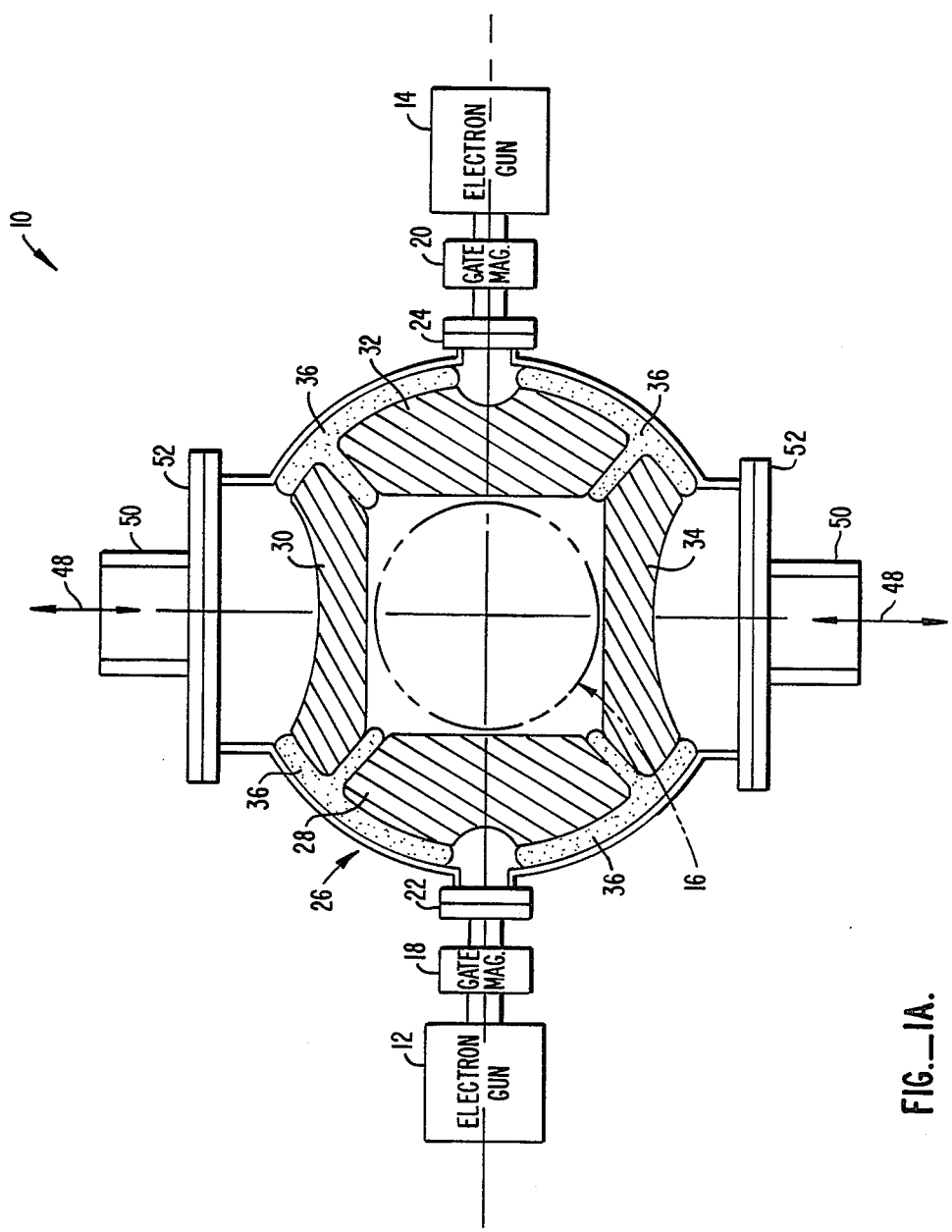
FIG._1A.

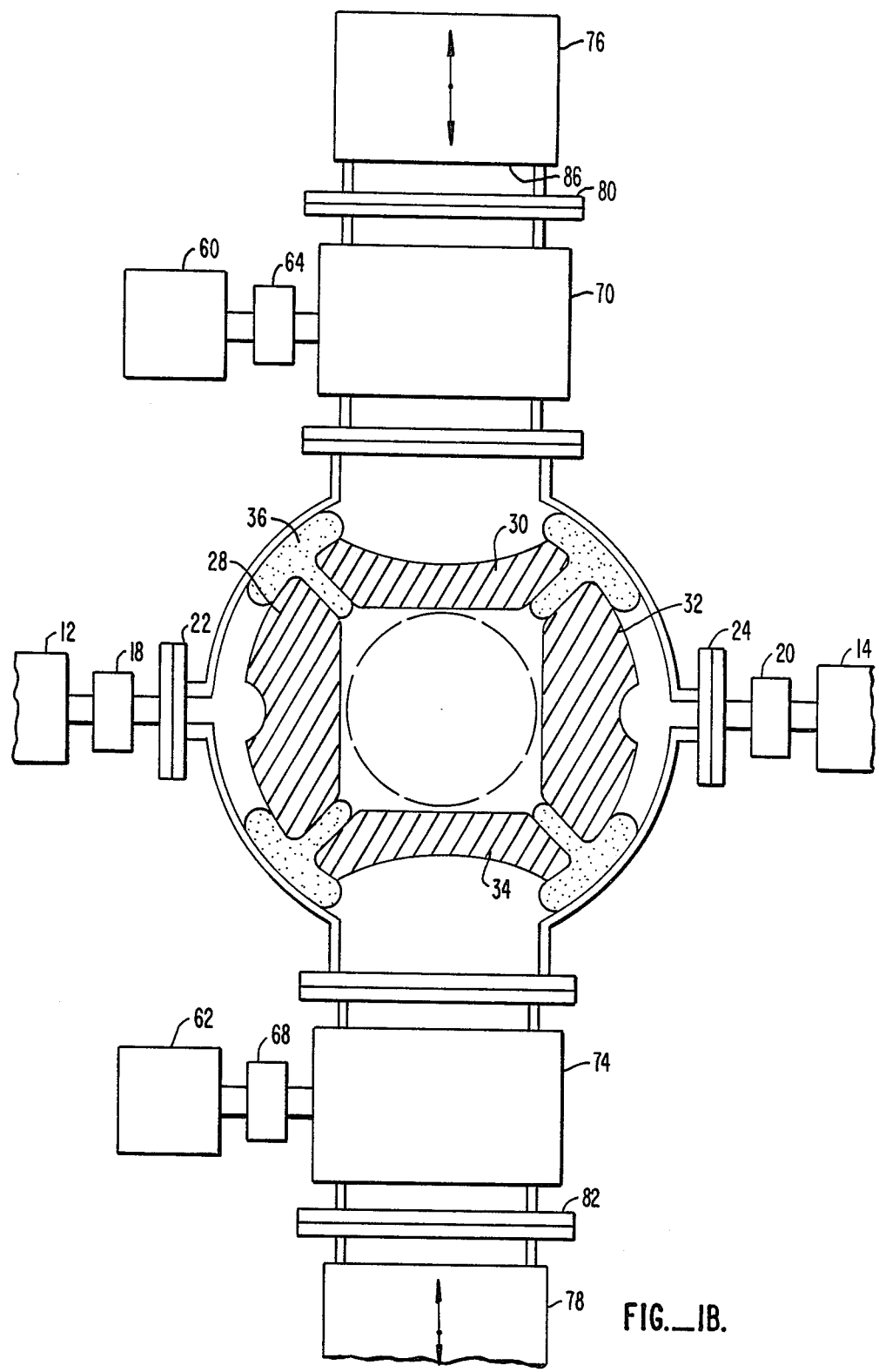
FIG._1B.

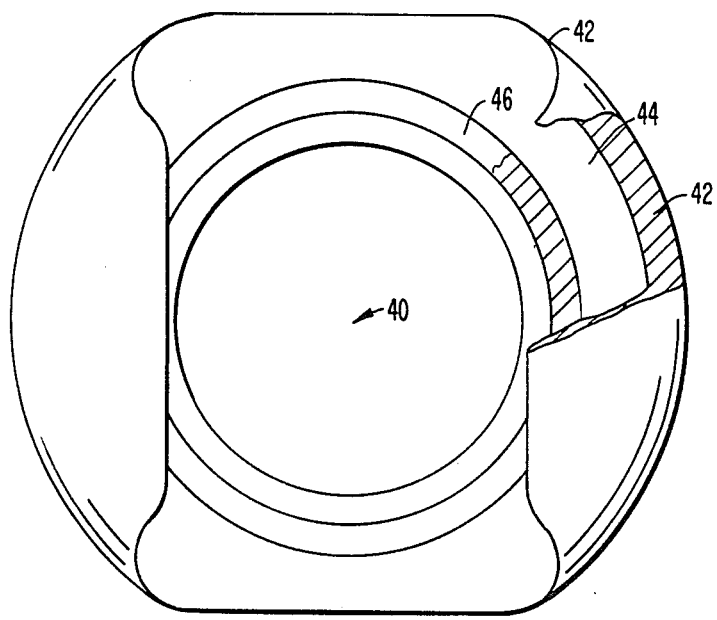
FIG._2A.
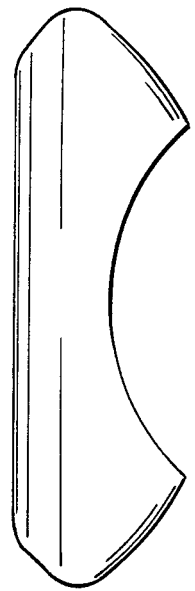
FIG._2C.
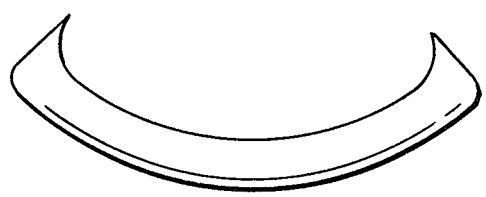
FIG._2B.

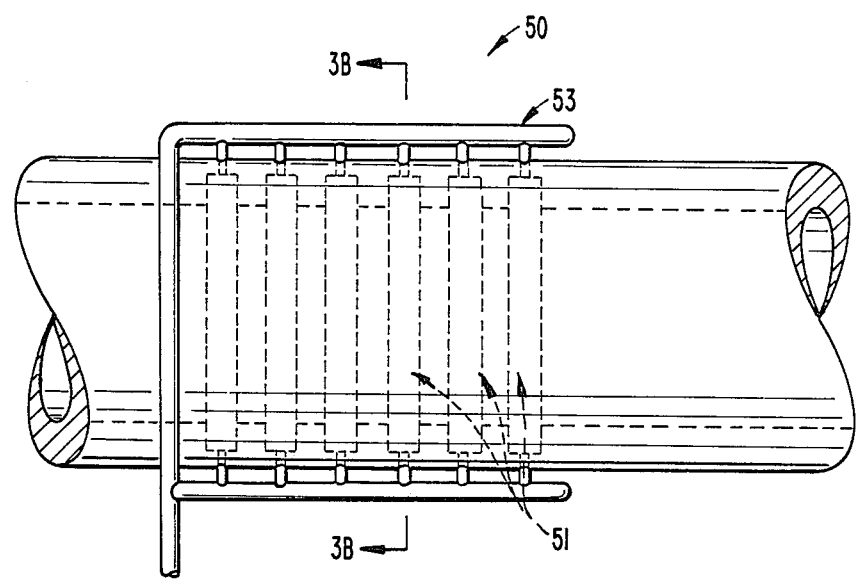
FIG._3A.
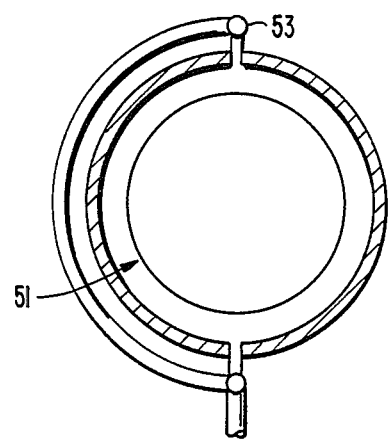
FIG._3B.

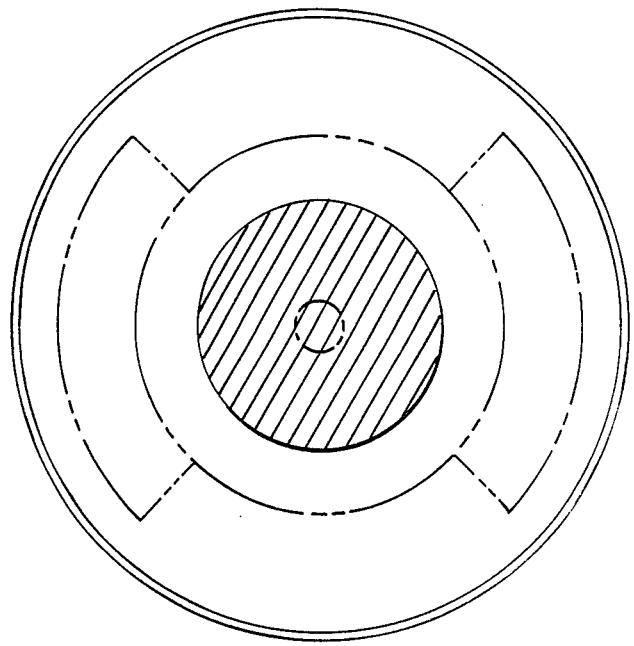
FIG._4B.
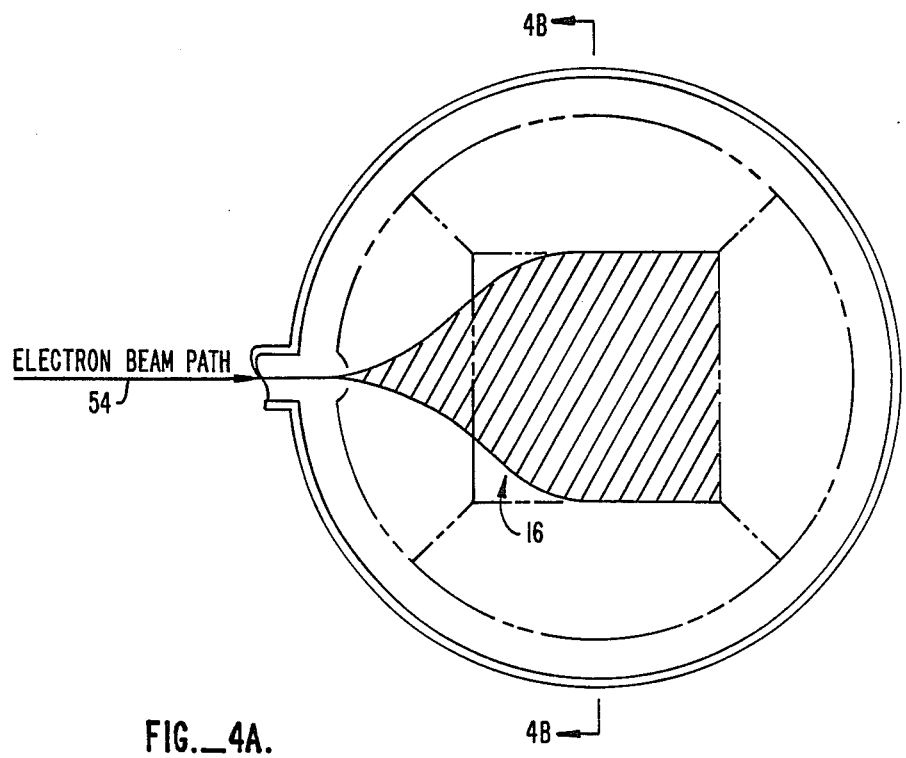
FIG._4A.

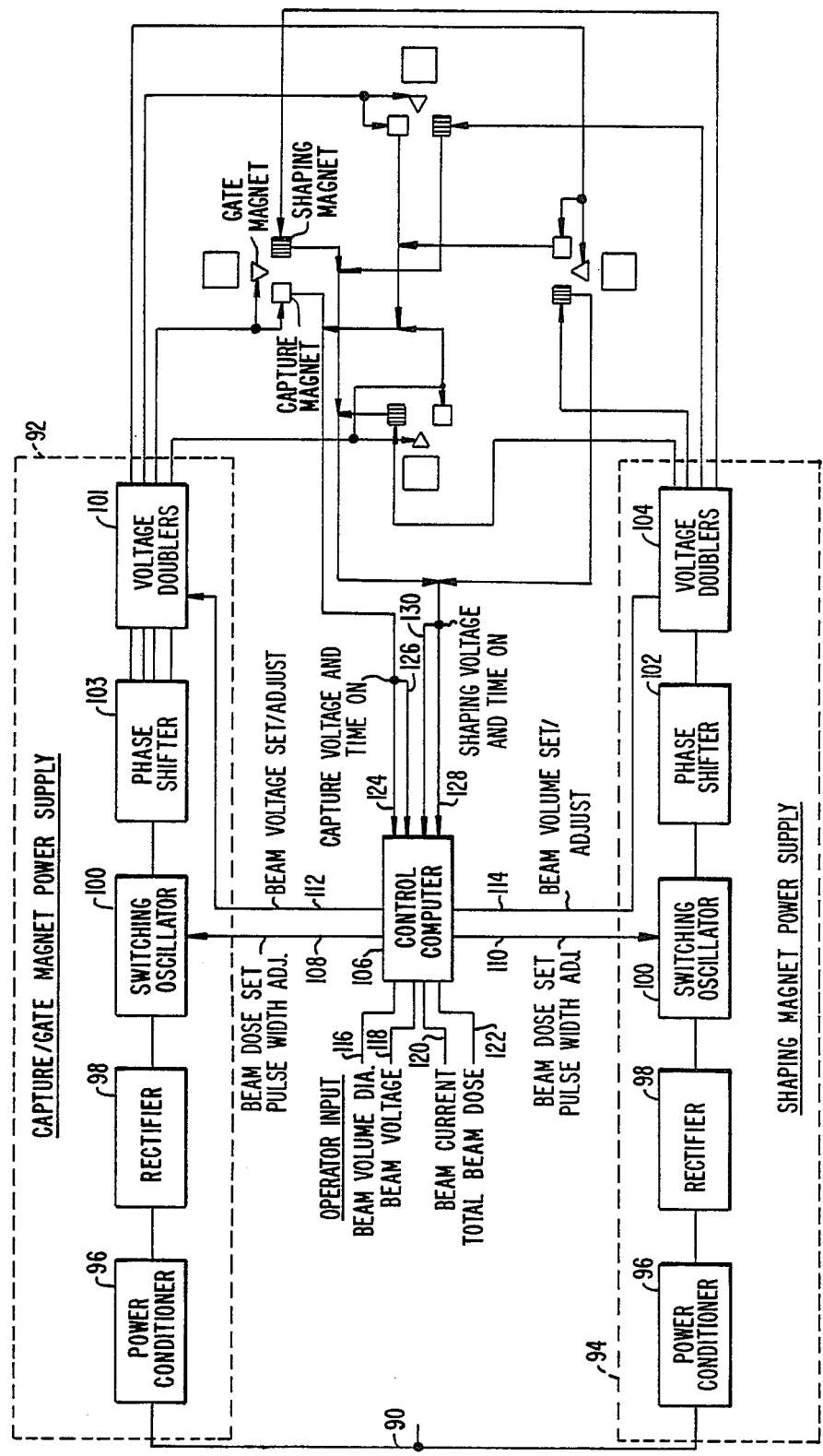
FIG._5.

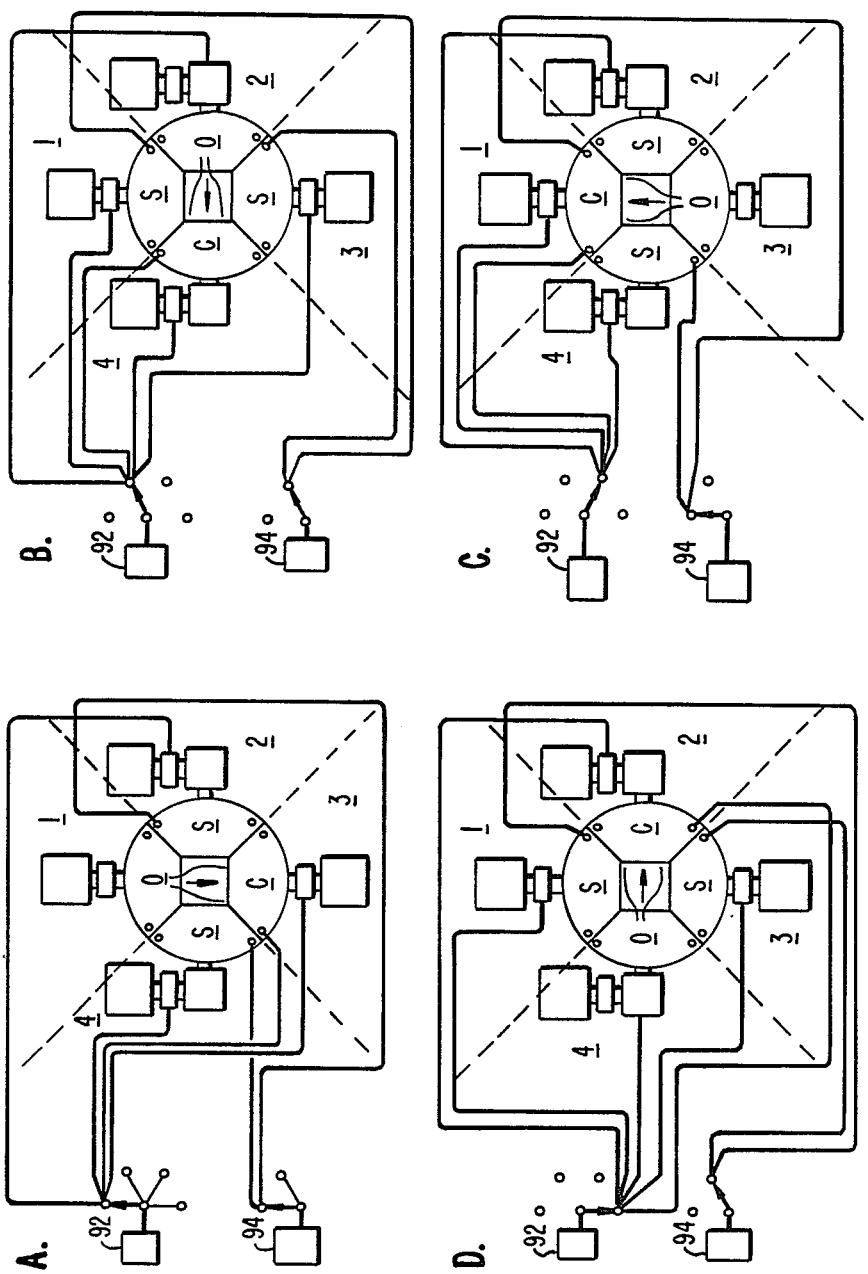
FIG._6.

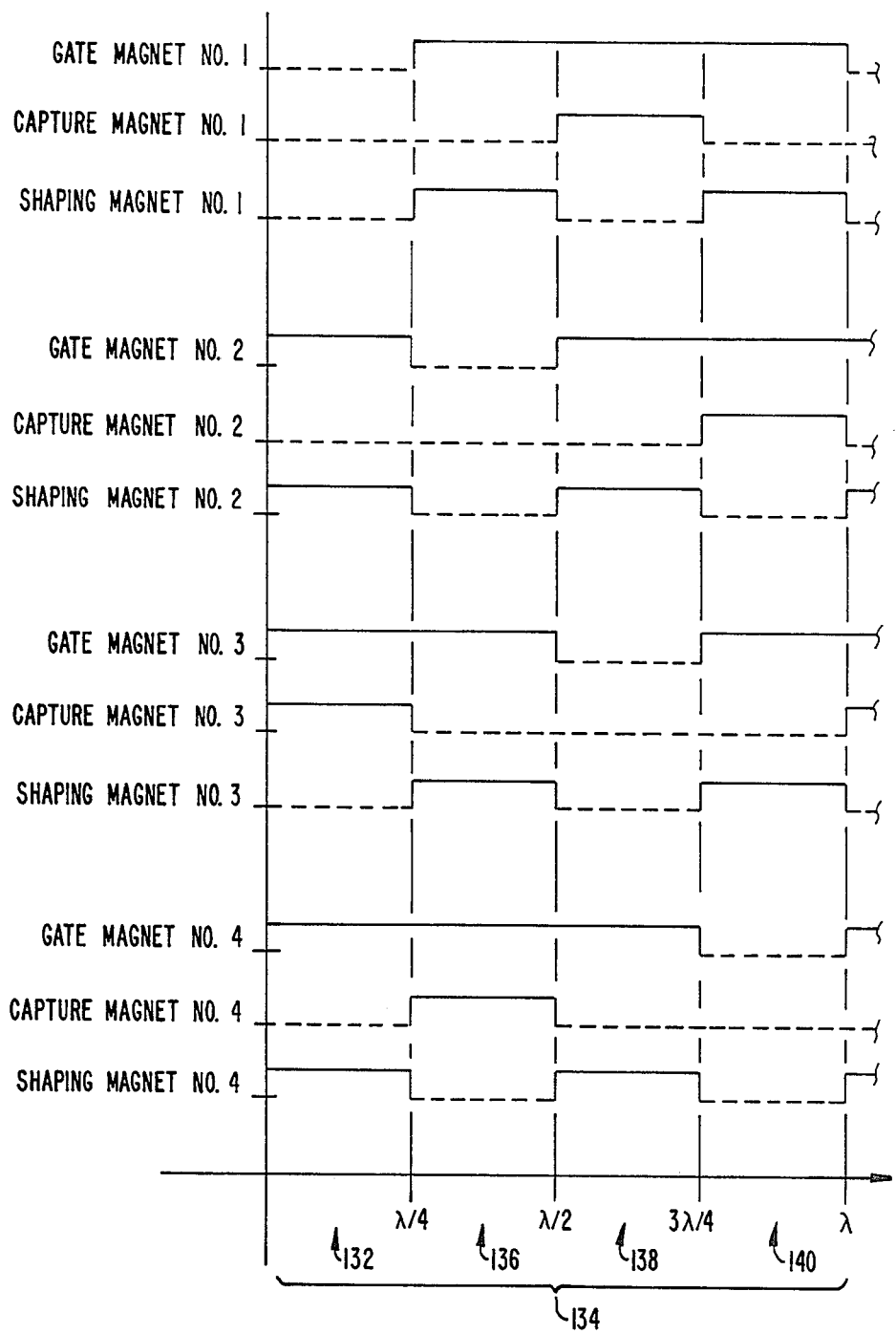
FIG._7.

ROTATING FIELD ELECTRON BEAM APPARATUS AND METHOD

BACKGROUND

The present invention relates to methods and apparatus for bombarding an object with charged particles, and more particularly for bombarding plastics with electrons to accomplish cross-linking.

Cross-linking is a process by which inter-molecular bonds are formed between the otherwise amorphous molecules of a polymeric plastic. The results of this process renders the plastic quasi-crystalline and therefore improved in its physical and electrical characteristics.

A chemical or electrical agent is employed to remove ("scavenge") hydrogen atoms from the hydrocarbon molecules of a polymer. The resulting open carbon valences then interlock forming inter-molecular bonds. The simplest form of cross-linking is the vulcanization of rubber using sulphur as the scavenging agent. Heating the rubber provides the energy needed to break the carbon-hydrogen atomic bonds. The sulphur, with two available valences, interposes itself between two single-valenced carbon atoms, forming a carbon-sulphur-carbon intermolecular bond, or cross-link.

For more complex hydrocarbons, organic peroxides may be used as the hydrogen scavengers. These are organic (carbon-hydrogen based) compounds containing positive free radicals which perform the same function as sulphur in the vulcanizing process. Again, heat provides the energy to break the carbon-hydrogen bond.

Electromagnetic energy in the form of alpha or beta particles, gamma rays, or even sunlight can accomplish the same ends: When plastic of sufficiently high molecular weight is exposed to any of these forms of radiation, direct carbon-carbon cross-links are obtained. Since the cross-links contain no interposing atoms (such as sulphur) the bonds thus formed are "strongest" in that they require the most energy input to "break."

Note here that regardless of the process used, free hydrogen is liberated. If allowed to concentrate, this gas presents a safety problem.

Today, most polymers are chemically cross-linked because the agent is easily dispersed in the plastic compound during the extrusion or molding process. These agents are expensive, explosive, highly toxic, and require time at elevated temperature to perform their tasks.

As mentioned above, cross-linking can be effectively accomplished using high energy electromagnetic radiation. Commonly, an electron beam (beta particles) similar to that emitted by a television picture tube is used. The kinetic energy of the electrons is sufficiently high to penetrate the polymer and then break the carbon-hydrogen bonds. Where electrons cannot be imparted with sufficient energy to perform the process, other forms of radiation having higher energies (e.g., gamma rays) are used.

As with all forms of radiation, shielding must be employed to prevent stray particles or rays from adversely affecting the general public. Large concrete structures are, therefore, employed to prevent this leakage to the environment.

At present, electron beam cross-linking is accomplished either uni- or bi-directionally in a single plane using a constant current of electrons.

U.S. Pat. No. 2,724,059 to A. J. Gale shows a standard electron gun with a flared end having shaping magnets within the flared end for directing the beam towards an object to be irradiated. The Gale magnets act as a magnetic lens to shape the beam leaving the electron gun. Gale shows the placement of two guns opposite the object to simultaneously bombard the object from both sides. U.S. Pat. No. 4,543,487 to Puumalainen, et al. shows an alternate method in which a filament is used to produce electrons, with a row of capture magnets being used to draw the electrons through the object. The power applied to the various capture magnets can be varied in order to maintain a uniform bombardment intensity despite variations in the physical properties of the filament.

U.S. Pat. No. 3,714,416 to Link, et al. shows a method for aiming the electron beam at an oblique angle of entry to the object to provide for a more uniform penetration of the electron beam into the object. U.S. Pat. No. 4,551,606 to Inoue shows a system in which the intensity of the electron beam is controlled through pulse width modulation.

These prior art devices exhibit one or more of the following disadvantages.

First, in the absence of capture magnets (such as those used in Puumalainen U.S. Pat. No. 4,543,487) the beam is, essentially, unguided, leading to "backscatter" or reflected energy leakage.

Second, the combination of constant beam current and electron capture within the plastic itself will allow, after a time, a static electrical charge to build up in the polymer. Unless drained off to ground using an auxiliary electrical conductor, this electrical potential may discharge to ground potential through the polymer resulting in pinholes. If the polymer itself is to be used as an electrical insulator, pinholes will provide an open path to ground during service, rendering the product unsafe for use.

Third, the process of using charged particles for cross-linking is most feasible for continuous objects, such as extruded wire insulation. To cross-link individual objects would require actual, physical rotation of the object under the beam to allow for uniform dose throughout the (perhaps irregular) object volume. This process is time-consuming and costly since the beam must be shut off and restarted after each rotation. In the two gun approach of Gale U.S. Pat. No. 2,724,059, the intensity must be limited to prevent interference caused by the beams going all the way through the object.

In other areas of technology, magnets are used to control charged particles for other purposes. For instance, in the bombardment of silicon wafers with charged particles, a charged particle gun will produce a beam which can have its direction changed by magnets to allow mounting the gun below the wafer and directing the beam to impinge upon the wafer from above. Additionally, magnets may be used to focus charged particles onto the silicon wafer. One such focusing mechanism is shown in U.S. Pat. No. 4,366,383 to Sano, et al.

Another technology in which magnets are used in conjunction with charged particles is the field of nuclear fusion reactors. Here, containment magnets are used to prevent the fusion plasma and the by-products of the fusion process from escaping the system.

SUMMARY OF THE INVENTION

The present invention is an improved method and apparatus for bombarding an object with charged particles. A shaping magnet is provided to spread the beam of charged particles emitted by a charged particle gun after the beam has left the gun. The beam is shaped so that it will completely envelope the object and provide substantially uniform penetration. The shaping of the electron beam is done after the beam has left the electron gun, unlike the prior art devices which shape the beam in the gun to produce a focusing effect. This provides more control over the shape of the beam.

According to another feature of the invention, a pair of charged particle guns on substantially opposite sides of the object are used with the guns being alternately switched on and off. Each gun is encircled by a capture electrode which serves to capture the beam of electrons from the opposite gun. By alternately switching on the opposing guns, high intensity beams can be used without interfering with an opposing beam. For many applications, the charged particles will be electrons and an electron gun will be used. The shaping magnets are arranged along a plane parallel to the guns and the beam of electrons as it is emitted from the guns. The shaping magnets serve to draw the electrons parallel to their surface, thus causing the beam to diverge into an essentially spherical volume. The shaping magnets have a hollow center, allowing a cylindrical object (such as a wire, tube or pipe) to be drawn through and alternately bombarded from either side with electrons.

Additionally, in the preferred embodiment, the capture electrodes are placed within the shaping magnets and alternately switched on (with the surrounding shaping magnet being switched off), thus providing more uniform distribution of the bombarding electrons within the object. Alternately, two additional electron guns are provided so that a total of four guns are present, with a four-phase signal beam used to alternately switch on and off the respective guns, their opposing capture electrodes, and associated shaping magnets and electrodes. In this configuration, the magnets will be switched through four states in each cycle so that (1) the electron beam from a first gun will penetrate through in a straight line from one side, (2) a beam from the second gun will penetrate through in a straight line on an axis 90° from the first beam, (3) a beam will penetrate through the object on an axis 180° from the first beam, and (4) a beam will penetrate through the object on an axis 270° from the first beam.

The use of an alternating electron beam impinging from either side and contact with earth potential at vessel ingress and egress prevents the build-up of static electrical charge within the object, in addition to providing for a more uniform bombardment of the object. Additionally, the present invention enables an object to be completely cross-linked on a single pass through the system of the present invention, without requiring the object to be turned and passed through a second time.

The magnet/electrodes are preferably shaped from a truncated right spherical cone with a shaping magnet on the outside, a capture electrode on the inside and an insulating material in between.

Finally, the entire process is conducted in a vacuum which, since no air ionization occurs, enhances beam utilization in cross-linking, resulting in higher efficiencies.

For a fuller understanding of the nature and advantages of the invention, reference should be made to the ensuing detailed description taken in conjunction with the accompanying drawings.

BRIEF DESCRIPTION OF THE DRAWINGS

FIG. 1A is a sectional view of a rotating field electron beam assembly according to the present invention for bombarding a continuous, elongated object;

FIG. 1B is a sectional view of the assembly of FIG. 1 adapted for bombarding a discrete object;

FIGS. 2A, 2B and 2C are front, partially in section, top and side views of a shaping magnet/capture electrode of FIG. 1A;

FIGS. 3A and 3B are a plan and section view, respectively, of the continuous feedthrough vacuum seal of FIG. 1A;

FIGS. 4A and 4B are sectional views of a single spreading electron beam in the embodiment of FIG. 1A or 1B;

FIG. 5 is a block diagram of the power system control for the electron guns and shaping magnets and capture electrodes of the embodiment of FIG. 1A or 1B;

FIG. 6 schematically shows the magnets of FIG. 1B provided with power during various phases of a cycle as connections made during each phase; and FIG. 7 is a timing diagram showing the signals for activation of the various magnets and electrodes of FIG. 1B.

DETAILED DESCRIPTION OF THE PREFERRED EMBODIMENTS

FIG. 1 shows a sectional view of a rotating field electron beam assembly 10 according to the present invention. A pair of electron guns 12, 14 are provided on either side of a beaming area 16 where a specimen may be placed. Each electron gun has an associated gate electrode 18, 20. Each gate electrode acts as a valve to shut off or regulate the flow of electrons from an electron gun. When energized, the gate electrode will have sufficient positive potential to effectively ground the flow of electrons from its associated electron gun. Alternately, a weaker positive potential is used to provide acceleration of the beam into beaming area 16.

Each gate electrode 18, 20 is coupled to a port assembly 22, 24, respectively. Each port assembly is a mechanical mount attaching its associated gate electrode and electron gun to vacuum chamber 26. It has sufficient structural rigidity to provide for beam alignment and is designed to maintain the vacuum required in vacuum chamber 26. Each port assembly is sealed to vacuum chamber 26 using dual "O" rings and tension bolts.

Vacuum chamber 26 is preferably a spherical, stainless steel chamber which serves several functions. (1) Vacuum chamber 26 contains the magnetic field. (2) Vacuum chamber 26 provides a vacuum envelope. (3) The vacuum chamber gives a support surface for the internal magnets and electrodes described below. (4) The vacuum chamber acts as a secondary shield for stray, low energy electrons.

Four combination shaping magnets and capture electrodes 28, 30, 32 and 34 are mounted in vacuum chamber 26 against four radiation shields 36. Radiation shields 36 are preferably made of high density polyurethane foam or lead. The radiation shields absorb the energy of electrons not absorbed by the shaping magnet/capture electrodes 28, 30, 32 and 34. The radiation shields will either stop the electrons completely, or allow their capture by the walls of vacuum chamber 26. Shaping magnets/capture magnets 28, 30, 32 and 34 are shown in more detail in FIGS. 2A-2C.

Turning to FIGS. 2A-2C it can be seen that the shaping magnets/capture electrodes 28-34 are shaped from a truncated right spherical cone. The frustum of the cone is defined by passing a right cylinder, whose diameter is that of the beaming volume, diametrically through the sphere from which the cone is taken and parallel to the base of the cone. The base of the cone is penetrated by a similar cylinder, but normal to the plane of the base. This cylinder forms a hole 40 which allows for the passage of either an electron beam (magnets 28, 32) or an article to be beamed magnet/electrodes 30, 34).

As can be seen from FIG. 2A, each of the shaping magnets/capture electrodes consists of a shaping magnet 42 separated by an insulating material 44 from a capture electrode 46. Shaping magnet 42 is a coil of insulated copper wire of sufficient turns and inductance to induce a magnetic field of the strength required to affect a beam of electrons and to cause it to pass parallel to the surface of the magnet. Capture electrode 46 is simply a positive electrode to attract negative electrons and is a plate or a coil of copper or similar conducting material of sufficient surface area and thickness to conduct the complete energy of one electron beam without overheating or requiring additional cooling. In addition, this electrode serves to "short out" the magnetic field induced by shaping magnet 42 and thus confining the magnetic field to the beaming area 16.

Insulating layer 44 is electrical insulation of sufficient dielectric strength to cancel the electric field generated during energization of shaping magnet 42. Insulation 44 is designed only to insulate the electric field generated by shaping magnet 42 while minimally effecting the electric field generated by capture electrode 46.

Returning to FIG. 1, the specimen to be beamed can be fed in the direction of arrows 48 through a feedthrough assembly 50 into beaming area 16. Feedthrough assembly 50 is coupled to vacuum chamber 26 with adapter flanges 52 which are simple double "O" ring flanges.

In operation, when electron gun 12 is energized by deenergizing gate electode 18, capture and shaping magnets 28 are de-energized, while the shaping magnets 42 of capture electrode/shaping magnets 30, 34 are energized and capture electronic 46 of shaping magnet/capture electrode 32 is energized. This configuration causes electron beam 54 to diverge in beaming volume 16 as shown in FIG. 4A. The beam thus assumes a spherical shape as shown in cross-section in FIG. 4B. This spread electron beam provides a more uniform distribution of electrons across the width of the specimen. In the focusing magnets of the prior art, the electrons would be more concentrated towards the center of the specimen than at the edges.

After electron gun 12 is energized, it is subsequently de-energized and electron gun 14 is energized. Electron gun 14 is energized by de-energizing gate electrode 20 to allow the electron beam to exit. At the same time, the capture electrode of shaping/capture electrode magnet 28 is activated while shaping magnet/capture electrode 32 is deactivated. Simultaneously, the shaping magnets of shaping magnet/capture magnets 30, 34 are activated. This sequence of alternately energizing the guns and the magnets and electrodes is repeated at high frequency while the specimen is being pulled through the assembly in a direction of arrows 48.

An alternate arrangement shown in FIG. 1B allows for the bombardment of a discrete specimen from four sides. Additional electron guns 60, 62 with their associated gate electrodes 64, 68, respectively, are provided. Also provided are right angle magnets 70, 74 to bend the beam of electrons from guns 60, 62, respectively, by 90° to force the beams into beaming area 16. These right angle magnets allow placement of the electron guns out of line with the axis of the movement of the specimen to be cross-linked. Magnets 70, 74 thus have a hole through the middle of them allowing the passage of the specimen. Air locks units 76, 78 are provided and are coupled to adapter flanges 80, 82, which are coupled to right-angle magnets 70, 74, respectively. Air locks 76, 78 are used to maintain a vacuum in vacuum vessel 16 during production runs. They are designed in the same manner as those used in submarines and allow the loading and unloading of individual specimens for beaming while other specimens undergoing the cross-linking process, thereby maximizing the system throughput efficiency. Each of air locks 76, 78 is composed of a vacuum-tight chamber with two opposed doors 84, 86 constructed to use outside air pressure to assist in maintaining a vacuum-tight integrity. When outer door 84 (leading to the external environment) is opened, the inside of air lock chamber 76 is at atmospheric pressue and inner door 86 (leading to vacuum chamber 26) is closed and sealed. A specimen may then be placed into the chamber. Outer door 84 is then closed and air lock chamber 76 evacuated to match the vacuum inside vacuum chamber 26. Inner door 86 may then be opened, permitting transfer of the specimen to vacuum chamber 26 for beaming.

FIGS. 3A and 3B are plan and section views of continuous feedthrough assembly 50 of FIG. 1A. This device is also fitted with a separate vacuum system to maintain the integrity of the vacuum boundary when continuous or extruded shapes are to be beamed. Two of these devices are provided and are located at diametrically opposed positions. When singular or noncontinuous shapes are to be beamed, these feedthroughs are replaced by blind flanges or by the right angle magnets and air locks of FIG. 1B.

Vacuum seal to the plastic tubing or plastic insulated wire is accomplished through use of a series of parallel, concentric rings 51 machined in the inner wall of the feedthrough assembly and connected through a header 53 to the vacuum system. When the vacuum system is operated, the tubing will be drawn to the inner wall of feedthrough assembly 50 and sealed thereto.

FIG. 5 is a block diagram of a power supply for controlling the gating electrodes, shaping magnets and capture magnets of the present invention. An AC line voltage is provided on a line 90 to a pair of power supplies 92, 94. Power supply 94 controls the shaping electrodes while power supply 92 controls the gate and capture magnets.

Two power supplies are used for several reasons. One power supply controls the capture magnets, which may have a different energization duty cycle from the shaping magnets. The shaping magnets are controlled by the other power supply. By varying the duty cycle of the shaping magnets, the electron beam can be tuned to widen or narrow it. In addition, two supplies are used because the shaping magnets float at the potential of the capture electrodes, which are equal and opposite to the potential of the electron beam (approximately 12,000–15,000 volts). The shaping magnets are varied only a few hundred volts around the capture electrode potential and can assume any value in this range. The capture electrodes, on the other hand, are either fully on or fully off. The capture electrode supply can be grounded with the electron gun floating, or vice versa.

Each power supply has a power conditioner 96 to suppress line surges and to provide harmonic isolation from the commercial power system. A full wave rectifier 98 produces DC power from the line voltage. A high frequency switching oscillator 100 produces square wave pulses at the line voltage. Phase shifters 102, 103 shift the phase of the square wave signal to produce the offset pulses during each cycle shown in FIG. 7 to the various magnets and electrodes. Phase shifter 102 of power supply 94 produces the pulses for the shaping magnets, while phase shifter 103 of power supply 92 provides twice as many lines to provide signals to both the gate electrodes and the capture electrodes. Voltage doubling networks 104, 105 each include a transformer and capacitive storage elements to give the working voltage.

A control computer 106 provides control signals on lines 108, 110 to switching oscillators 100 to control the pulse width of the square wave signals produced by the switching oscillators. By controlling the pulse width, the dosage of the electron beam can be controlled. The beam voltage is controlled by a signal on line 112 from control computer 106 to voltage doubler 105. The voltage of this signal controls the voltage applied to the gate and capture electrodes, and thus the voltage potential which accelerates the electrons is controlled. The control signal on a line 114 to voltage doubler 104 controls the voltage applied to the shaping magnets, and thus controls the volume to which the electron beam is spread. The higher the relative voltage, the greater the volume to which the electron beam is spread because the closer the beam will be to the shaping magnets.

Operator inputs to control computer 106 include a beam volume diameter control 116, a beam voltage control 118, a beam current control 120 and a total beam dosage 122. Feedbacks to control computer 106 are provided for a capture voltage 124, a capture voltage ON time 126, a shaping voltage 128 and a shaping voltage ON time 130. The capture voltage and shaping voltage feedbacks are used to adjust the signals to voltage doublers 104, 105, in conjunction with the on times to provide the average voltage desired.

The voltage applied to the capture electrodes is determined by the work in MeV (million electron volts) of the beam and electrical permittivity of the material to be beamed. The capture electrode power supply 92 takes commercially available 60 Hz utility grade electrical power and converts it into 10 kHz square wave pulses with sufficient positive voltage to accelerate and capture an incident beam of electrons. For a given beam intensity (current) and work output (MeV) the voltage for the capture electrode can be calculated from the equation:

$$\text{voltage} = \frac{\text{work output (kWH)}}{\text{amps} * PF(\text{power factor})/1000 * \text{ON time(hours)}}$$

The voltage calculated from this equation must be multiplied by the permittivity of the material to be beamed (e.g., polyethylene permittivity is approximately 6.5) to account for its resistance to the electrical current flow.

The square wave shape provides the required "dwell" time at high voltage needed to produce a work output from the system. The rise and fall times of the square wave can be controlled to assure uniform penetration of the beam through the material to be crosslinked.

FIG. 7 is a timing diagram for a cycle of the voltages applied to the various magnets by power supplies 92 and 94. FIGS. 6A, B, C and D show in diagram form the voltages applied to the various magnets during the four phases of a cycle shown in FIG. 7. The magnets are divided into four quadrants 1–4 with each quadrant having a gate electrode, a capture electrode and a shaping magnet. The connections shown in FIG. 6A correspond to the first quarter 132 of a cycle 134 in FIG. 7. No power is supplied to the gate magnet, capture magnet or shaping magnet in quadrant 1, from which the electron beam is projected. These magnets are off as indicated on the diagram. In quadrant 2, the gate electrode and the shaping magnet are activated while the capture electrode is deactivated. The gate magnet turns off the electron gun from this quadrant and the shaping magnet helps spread the electron beam. Similarly, in quadrant 4, the gate electrode and the shaping magnet are activated while the capture electrode is deactivated. In quadrant, the capture magnet is activated along with the gate magnet, while the shaping magnet is deactivated. Thus, the capture electrode of quadrant 3 will collect the electron beam.

Similarly, FIGS. 6B, 6C and 6D correspond to a second quarter 136, a third quarter 138 and a fourth quarter 140, respectively, of cycle 134 as shown in FIG. 7. As shown in FIGS. 6A–D, this sequencing of the magnets results in the electron beam being first projected from quadrant 1 to quadrant 3, then from 2 to 4, then from 3 to 1, and finally from 4 to 2.

As will be understood by those familiar with the art, the present invention may be embodied in other specific forms without departing from the spirit or essential characteristics thereof. For example, a different shape can be given to the shaping magnet or a number of magnets other than that shown can be used. By turning on a capture electrode at 90° to the emitted electrons, the beam of electrons can be made to do a 90° turn. Alternately, the magnets can be pulsed in such a manner that the chamber acts as a resonant cavity. Accordingly, the disclosure of the preferred embodiment of the invention is intended to be illustrative, but not limiting, of the scope of the invention which is set forth in the following claims.

What is claimed is:

1. An apparatus for bombarding an object with charged particles, comprising:
   a charged particle gun for directing said charged particles in a beam toward said object;
   means for positioning said object in front of said charged particle gun;
   at least one magnet positioned in front of said charged particle gun and shaped to spread said beam; and
   a capture electrode positioned in front of said charged particle gun, so that said object is between said gun and said capture electrode, for attracting and capturing said charged particles.

2. The apparatus of claim 1 wherein said charged particles are electrons.

3. The apparatus of claim 1 wherein said magnet is an electromagnet encircling said capture electrode and further comprising an insulating material coupling said electromagnet to said capture electrode.

4. An apparatus for bombarding an object with charged particles, comprising:
   a charged particle gun for directing said charged particles in a beam toward said object;
   means for positioning said object in front of said charged particle gun;
   a first electrode positioned in front of said charged particle gun and shaped to spread said beam;
   a second charged particle gun substantially opposite said first mentioned charged particle gun, said first electrode at least partially encircling said second gun; and
   a second electrode at least partially encircling said first gun and shaped to spread and capture a beam of charged particles emitted from said second gun.

5. The apparatus of claim 4 further comprising means for alternately switching said first and second guns on and off.

6. The apparatus of claim 5 further comprising first and second electromagnets, encircling said first and second electrodes, respectively, to shape said beam, said means for switching including means for switching said first electromagnet and first electrode on only when said second gun is on and means for switching said second electromagnet and second electrode on only when said first gun is on.

7. The apparatus of claim 5 wherein said switching means comprises first and second gate electrodes coupled to a front end of said first and second guns, respectively, and means for switching on said first gate electrode to switch off said first gun and means for switching on said second gate electrode to switch off said second gun.

8. The apparatus of claim 7 further comprising first and second shaping magnets disposed on either side of a line between said first and second guns, said shaping magnets being operative to spread a beam of charged particles from said first and second guns.

9. The apparatus of claim 8 further comprising:
   third and fourth electron guns positioned to emit a beam of charged particles through said first and second shaping magnets, respectively, said shaping magnets defining a central hole, and a pair of capture electrodes disposed within said first and second shaping magnets, respectively.

10. An apparatus for bombarding an object with charged particles, comprising:
    a first charged particle gun for directing a first beam of said charged particles toward said object;
    a second charged particle gun positioned opposite said first gun for directing a second beam of charged particles toward said object;
    means for positioning said object between said first and second guns;
    a first capture electrode at least partially encircling said first gun for attracting said second beam of charged particles;
    a second capture electrode at least partially encircling said second gun for attracting said first beam of charged particles; and
    means for switching said first gun and said second capture electrode on and off in synchronization and alternately switching said second gun and said first capture electrode on and off in synchronization.

11. A method for bombarding an object with charged particles from a pair of charged particle guns arranged substantially opposite one another, comprising the steps of:
    positioning said object between said guns;
    alternately switching said first and second guns on and off;
    providing first and second shaping magnets beyond a front end of said first and second guns, respectively, said first and second shaping magnets being operative to spread a beam of charged particles from said first and second guns, respectively;
    providing first and second capture electrodes opposite said first and second guns, respectively, for attracting and capturing said charged particles;
    switching said first shaping magnet and said first capture electrode on and off in synchronization with switching said first gun on and off; and
    switching said second shaping magnet and said second capture electrode on and off in synchronization with switching said second gun on and off.

* * * * *